United States Patent [19]

Gesche et al.

[11] Patent Number: 5,025,135

[45] Date of Patent: Jun. 18, 1991

[54] CIRCUIT CONFIGURATION FOR THE RECOGNITION OF A PLASMA

[75] Inventors: Roland Gesche, Seligenstadt; Norbert Vey, Mittel-Gründau, both of Fed. Rep. of Germany

[73] Assignee: Leybold Aktiengesellschaft, Hanau, Fed. Rep. of Germany

[21] Appl. No.: 364,812

[22] Filed: Jun. 9, 1989

[30] Foreign Application Priority Data

Jun. 23, 1988 [DE] Fed. Rep. of Germany ....... 3821208

[51] Int. Cl.⁵ ............................................. B23K 9/00
[52] U.S. Cl. ............................ 219/506; 219/121.54; 219/121.57; 219/121.43; 156/345; 204/298.32; 204/298.38
[58] Field of Search ................ 219/121.36, 121.4, 506, 219/121.43, 121.54, 121.57; 156/345, 643, 646; 204/298.32, 298.38

[56] References Cited

U.S. PATENT DOCUMENTS

| | | | |
|---|---|---|---|
| 3,988,566 | 10/1976 | Vogts et al. | 219/121.47 |
| 4,207,137 | 6/1980 | Tretola | 156/627 |
| 4,280,042 | 7/1981 | Berges et al. | 219/121.54 |
| 4,493,112 | 1/1985 | Bruene | 455/123 |
| 4,609,810 | 9/1986 | O'Brien et al. | 219/121.54 |
| 4,640,627 | 2/1987 | Tracy et al. | 219/121.54 |
| 4,656,331 | 4/1987 | Lillquist et al. | 219/121.54 |

OTHER PUBLICATIONS

"Plasma Potentials of 13.56 MHz RF Argon Glow Discharges in a Planar System", pp. 59-65, J. Appl. Phys., 57(1), Jan. 1, 1985.
Electrostatic Probe Analysis of Microwave Plasmas Used for Polymer Etching, pp. 348-354, J. Vac. Science & Technology, Jan. 1987.
"Plasma Etching Semiconductor Fabrication", Russ, Morgan, 1985, pp. 203-239.

Primary Examiner—M. H. Paschall
Attorney, Agent, or Firm—Felfe & Lynch

[57] ABSTRACT

The invention relates to a circuit configuration for the recognition of a plasma which is supplied with energy by means of an ac current of preset frequency. This ac current is detected by way of a suitable sensor and feeds to a highpass filter. This highpass filter permits those frequencies to pass through which lie above the preset frequency. The output signal of the highpass filter is rectified through a rectifier, freed of its residual ripple through a lowpass filter, and supplied to an evaluation device.

8 Claims, 1 Drawing Sheet

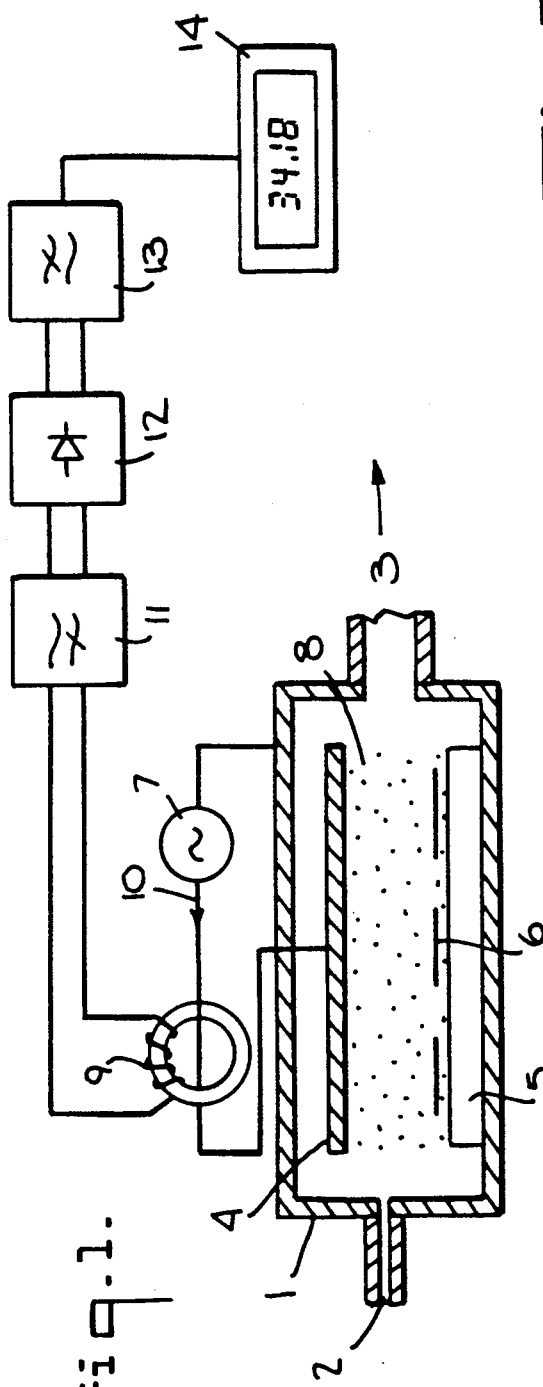
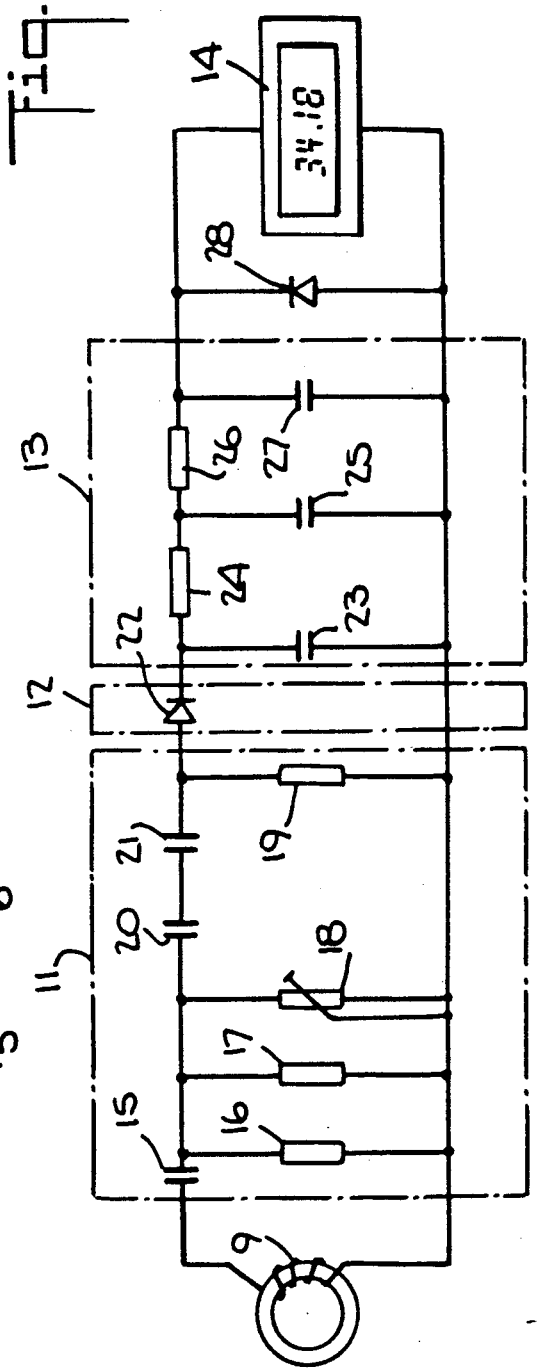

CIRCUIT CONFIGURATION FOR THE RECOGNITION OF A PLASMA

The invention relates to a circuit configuration for the recognition of a plasma.

With the aid of plasmas numerous material-working processes are carried out. It is for example customary to etch or coat glasses, metals and other materials by means of plasmas. In particular in the semiconductor industry, where the outer dimensions of the structural elements are becoming increasingly smaller, wet etching processes are being increasingly displaced by plasma etchings, which permit a better removal of silicon or of polymerous materials.

The plasmas required for this can be produced in different ways. Apart from the dc voltage processes, in which a glow discharge is generated, ac voltage processes are used, which operate with a high frequency energy feed which is preferably operated in the range of 13.56 MHz.

It is of importance in all plasma processes to determine the onset of the plasma formation and to monitor the maintenance of the plasma.

A very simple method to determine the presence of a plasma rests on the light which originates from the plasma. The greater the light intensity the greater is the ionization of the plasma. The disadvantages of the optical process consist in that the measurement can be influenced by external light and that the measuring window becomes coated and consequently becomes opaque during operation of the installation.

It is furthermore known to determine the presence of plasmas by means of plasma probes (J. E. Heidenreich III and J. R. Paraszczak: "Electrostatic probe analysis of microwave plasmas used for polymer etching", J. Vac. Sci. Technol. B 5(1), Jan./Feb. 1987, pages 347 to 354). The disadvantage of such probes consists in that they must be introduced into the plasma directly and that consequently a vacuum feedthrough is necessary. In addition, a probe is endangered or interferes with assembly and maintenance operations. There is also the fact that the operating life of a plasma probe is limited since it is for example also coated by sputtering of dielectrics and hence becomes insulated. Through this coating the measured values change continuously, whereby quantitative statements become problematic.

In addition, a method for the regulation of a plasma etching process is known in which an impedance change of the high frequency power is indicated (U.S. Pat. No. 4,207,137). In this method a selected zone on a coating which is located on a body is etched in that the body is first disposed in a chamber and between electrodes, that subsequently a gas is introduced into the chamber, and subsequently electric power is supplied to the electrodes in order to generate plasma in the chamber. The impedance change of the plasma is indicated during the entire etching process with the electric power to the electrodes being switched off when the impedance change has essentially reached the value zero. With the aid of this method the termination of the etching process can be determined; it is however not possible to monitor the state of the plasma exactly and continuously. Since not every constancy of the impedance allows the conclusion that the etching process has been terminated, erroneous indications cannot be excluded in this known method.

Probably the best known method of determining the presence of plasmas with a high frequency supply consists in that the dc voltage potential of the feeding electrode is measured (K. Köhler, J. W. Coburn, D. E. Horne and E. Kay: "Plasma potentials of 13.56 MHz rf argon glow discharges in a planar system", J. Appl. Phys. 57(1), Jan. 1, 1985, pages 59 to 66). However, with insulating targets this method is highly problematic since the dc voltage potential in this case occurs on the target surface and this is galvanically insulated with respect to the metallic electrode member of the high frequency power feed-in. In many cases, therefore, no dc current can be extracted from the electrode and no dc current indication is possible.

Lastly, it is also known to measure the characteristics of the high frequency voltage and of the current as well as to detect the generation of the negative dc current bias in an insulating electrode which lies opposite the surface of a workpiece in the presence of inert and active gases (R. A. Morgan: Plasma Etching in Semiconductor Fabrication, publisher Elsevier, Oxford 1985, pages 203 to 239, in particular FIGS. 8.1 and 8.2 as well as 8.14 to 8.16). In so far as the negative dc voltage potentials of the upper electrode are measured, this known method has the same disadvantages as the previously described method. For the measurement of the high frequency potential an oscilloscope is used, the voltage peaks of which are photographed with the aid of an instant film. This method is very costly. For the measurement of the high frequency current a virtual electrode is used which simulates the current flow over a grounded electrode. This current flow is sent across a known resistance where a potential develops which, in turn, is reproduced on the oscilloscope. Photographs of the curves displayed on the oscilloscope are made, which is costly and elaborate. An electronic evaluation of the harmonic waves visible on the photographs does not take place herein.

The invention is based on the task of determining the presence of the plasma without the necessity of intervening into the plasma and without having to rely on the formation of a dc current component on an electrode or on a display on an oscilloscope.

This task is solved in accordance with the features of patent claim 1.

The advantage achieved with the invention consists in particular in that only the electrical high frequency energy supplied to the plasma is evaluated in order to reach a decision regarding whether or not a plasma is present. The plasma itself is neither optically inspected nor electrically analyzed. The method according to the invention rests on the accepted fact that a high frequency plasma represents a nonlinear impedance which generates harmonic waves. Since these harmonic waves occur only if a plasma is present they can be utilized for the recognition of a plasma.

An embodiment example of the invention is represented in the drawing and is described below in greater detail. In the drawing:

FIG. 1 shows a basic representation of the circuit configuration according to the invention for the recognition of a plasma;

FIG. 2 a filter and rectifier circuit with which harmonic waves are filtered out and processed.

In FIG. 1 the principle of a device is represented with which, for example, thin films can be deposited and which has a plasma detection according to the invention. This device has a chamber 1 in which a sample is located, further a gas inlet system 2, and a gas outlet system 3. In addition, a high frequency electrode 4 is also provided which generates a plasma and which is opposite a sample table 5 which is located in the chamber 1. A high frequency output extends from a high frequency power supply 7 to the electrode 4 whereby a plasma 8 is generated if pressure conditions from approximately $10^{-4}$ to 10 torr are present. Due to this plasma 8 a thin film is deposited on a substrate 6 which is disposed on the sample table 5. The high frequency which originates from the electrode 4 and which preferably is a frequency $f_0$ of 13.56 MHz dissociates the gas present in the chamber 1 and generates plasma in this manner.

In order to determine whether a plasma is present or whether the gas is still in the non-dissociated state, an inductive current reception is provided which detects the current J flowing to the electrode 4. This current reception consists, for example, of a toroid-shaped coil (9) (cf. U.S. Pat. No. 4,493,112, FIG. 3) which is placed around the feed line 10 which extends between the power supply 7 and the electrode 4. This coil 9 can have only one winding instead of several. Through the magnetic field which the current J generates around the feed line a voltage is induced in the coil 9 which reaches a highpass filter 11. This highpass filter 11 filters out all frequencies which are lower than 20 MHz. Hereby all dc current components of current J are suppressed as well as its fundamental frequency of 13.56 MHz. Permitted to pass are only harmonic waves which originate if a plasma is present. If no plasma is present the electrode 4 represents a reactance. Since the high frequency power supply 7 outputs a sine-shaped signal the current J in this case is purely sine-shaped. Hence no frequencies other than 13.56 MHz occur. At the output of the highpass filter 11 consequently a signal is only present if a plasma was generated because this is responsible for the harmonic waves. If a plasma has been excited, the electrode 4 due to the different mass of electrons and ions has a nonlinear impedance. Through this nonlinearity mixed products are generated which contain in particular the frequencies of the harmonic (27.12 MHz; 40.68 MHz etc.). The output signal of the highpass filter 11 is rectified through a rectifier 12 and placed on a lowpass filter 13. This lowpass filter 13 has only the task of eliminating the still present residual ripple of the dc voltage present at the output of rectifier 12 or at least to diminish it. The rectification smoothed in this manner is supplied to a display device 14 which indicates a magnitude which is a measure for the harmonic waves beyond 13.56 MHz and hence a measure for the development of the plasma.

In FIG. 2 the filters shown in FIG. 1 are again shown in greater detail. It can be seen that the highpass filter 11 contains a series capacitor 15 succeeded by two parallel inductors 16, 17. Parallel to these inductors 16, 17 is connected an adjustable resistor 18 followed by two series-connected capacitors 20, 21 in the series branch of the highpass filter 11 terminated by a parallel inductor 19. The output signal of the highpass filter 11 is rectified by means of a diode 22. Since this is a halfway [sic] rectification the residual ripple of the rectified signal is still relatively high. This residual ripple is decreased through the following lowpass filter 13, which contains a capacitor 23 in the shunt branch, connecting thereon an inductor 24 in the series branch, connecting on this a further capacitor 25 in the shunt branch, thereupon following a further inductor 26 in the series branch and lastly a capacitor 27 in the shunt branch. At the output of the lowpass filter 13 is placed a Zener diode 28, which prevents too high a voltage being supplied to the display 14.

The high frequency power supply 7 is an energy source which operates in the frequency range of approximately 100 MHz to 1 GHz. This frequency range is preferred for the reason that in customary installation sizes only in this frequency range do the different free path lengths of electrons and ions originate which are responsible for the nonlinearity of the plasma.

The configurations shown in FIGS. 1 and 2 can be used not only in order to recognize whether or not a plasma is present, but rather they also supply a quantitative signal which permits a statement regarding the ionization and the performance of the plasma. For example, two synchronously sputtering electrodes can be set to the same performance. For this purpose the output signal of the lowpass filter 13 would not be supplied to a display 14 but to an installation control computer (not shown) and in it evaluated for the control of the process. The display then takes place on a monitor of the computer.

While the current detection by means of a toroidal coil is very useful the invention is not limited to it. The current could equally well be detected by means of ohmic or capacitive voltage conductors.

The invention likewise is not limited to the feeding in of a pure ac current J with the frequency $f_0$. It can also be applied if a dc current modulated with an ac current is placed on the electrode 4.

We claim:

1. Method for the recognition of a plasma comprising: generating a high frequency ac current with preset frequency for generating a plasma; detecting with a circuit configuration the ac current (J); supplying a signal representative of the ac current (J) to a highpass filter which transmits frequencies lying above a preset frequency (fo); and evaluating the output signal of the highpass filter as criterion for the presence or absence of a plasma.

2. Circuit configuration for the recognition of a plasma comprising: means for recognizing a plasma including an electrode to which ac current (J) is supplied, an inductor which detects this ac current (J), a highpass filter, the inductor feeding the high pass filter a signal representative of ac current (J), the high pass filter having a limit frequency (fo), and an evaluation device connected with the high pass filter which evaluates an output signal of the high pass filter.

3. Circuit configuration according to claim 2 in which the ac current (J) is a high frequency ac current.

4. Circuit configuration as stated in claim 3, in which the high frequency ac current has frequency of 13.56 MHz.

5. Circuit configuration in accordance with claim 2, in which the highpass filter has an input and output and has from its input in the direction of its output a capacitor in a series branch followed in a shunt branch by two inductors and an adjustable resistor, and in which the elements of the shunt branch are followed by two capacitors in the series branch, and in which the highpass filter includes and is terminated by an inductor in the shunt branch.

6. Circuit configuration for the recognition of a plasma comprising:
    means for recognizing a plasma including a highpass filter having a limit frequency (fo), an evaluation device, including a rectifier connected with the highpass filter, which evaluates an output signal of the highpass filter, and a display device, the highpass filter supplying the output signal thereof to the rectifier, and the rectifier placing a signal representative of an output signal thereof on the display device, and a lowpass filter connected between the rectifier and the display device.

7. Circuit configuration as stated in claim 6, in which the lowpass filter has an input and an output and has from its input in the direction of its output in a shunt branch a first capacitor, in a series branch an inductor, in the shunt branch a second capacitor, in the series branch a second inductor, and in the shunt branch a third capacitor.

8. Circuit configuration as stated in claim 6, in which the lowpass filter has an output and which includes a Zener diode connected in parallel to the output.

* * * * *